United States Patent
Lee et al.

(10) Patent No.: US 6,258,725 B1
(45) Date of Patent: Jul. 10, 2001

(54) METHOD FOR FORMING METAL LINE OF SEMICONDUCTOR DEVICE BY (TIA1)N ANTI-REFLECTIVE COATING LAYER

(75) Inventors: Sang Hyeob Lee; Young Jung Kim, both of Ichon (KR)

(73) Assignee: Yundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/343,291

(22) Filed: Jun. 30, 1999

(30) Foreign Application Priority Data

Jun. 30, 1998 (KR) .................................. 98-25277

(51) Int. Cl.[7] ............................................. H01L 21/3065
(52) U.S. Cl. ...................... 438/712; 438/720; 438/725; 438/733; 438/742
(58) Field of Search .................... 438/712, 717, 438/720, 725, 733, 742, 785; 257/750, 758

(56) References Cited

U.S. PATENT DOCUMENTS

| | | | |
|---|---|---|---|
| 4,562,398 | 12/1985 | Mario et al. | 427/109 |
| 5,124,780 | 6/1992 | Sandhu et al. | 257/344 |
| 5,231,306 * | 7/1993 | Meikle et al. | 257/715 |
| 5,286,608 | 2/1994 | Koh | 430/313 |
| 5,525,542 | 6/1996 | Maniar et al. | 438/669 |
| 5,545,289 * | 8/1996 | Chen et al. | 438/694 |
| 5,569,398 | 10/1996 | Sun et al. | 219/121.68 |
| 5,633,210 | 5/1997 | Yang et al. | 438/669 |
| 5,679,448 * | 10/1997 | Kawata | 428/216 |
| 5,736,458 | 4/1998 | Tseng | 438/627 |
| 5,759,916 | 6/1998 | Hsu et al. | 438/636 |
| 5,781,509 | 7/1998 | Zahner | 367/159 |
| 5,846,880 * | 12/1998 | Lee | 438/669 |
| 5,846,884 * | 12/1998 | Naeem et al. | 438/714 |
| 5,880,018 | 3/1999 | Boeck et al. | 438/619 |
| 5,892,281 * | 4/1999 | Akram et al. | 257/750 |
| 5,948,716 * | 9/1999 | Kume et al. | 501/95.4 |
| 5,981,416 * | 11/1999 | Kune et al. | 501/96.4 |

* cited by examiner

Primary Examiner—Benjamin L. Utech
Assistant Examiner—Binh X. Tran
(74) Attorney, Agent, or Firm—Blakely Sokoloff Taylor & Zafman

(57) ABSTRACT

There is provided a method for forming a metal line of a semiconductor device, in which a (TiAl)N layer having a lower reflectivity and permeability is formed as anti-reflective coating layer. Since the (TiAl)N anti-reflective coating layer effectively prevent a metal line from reflecting in lightening process using a shorter wavelength such as DUV, a fine metal line can be formed exactly.

1 Claim, 1 Drawing Sheet

METHOD FOR FORMING METAL LINE OF SEMICONDUCTOR DEVICE BY (TIA1)N ANTI-REFLECTIVE COATING LAYER

BACKGROUND OF THE INVENTION

The present invention relates to semiconductor manufacturing, and more particularly, to a method for forming metal line of highly integrated semiconductor devices.

As a density of an integrated semiconductor device increases, a width of a pattern and a space between patterns become smaller. Since it needs to use a shorter wavelength for forming patterns having a narrow space in lightening process, the wavelength of a stepper is getting shorter and a deep ultraviolet wavelength (DUV) light become to be used.

According to using a shorter light such as DUV, a TiN anti-reflective coating layer which is over a metal line, doesn't effectively prevent the metal line from reflecting. Thus, since diffused reflection may be occurred during lightening, it is difficult that a resulting metal line pattern is not finely and accurately formed. To solve the diffused reflection, a oxynitride has been formed on the TiN layer, or an anti-reflective coating layer has been made from aluminum nitride. However, in the former method, the number of process steps is increased and it is not easy to make via contact hole for connecting an interlayer metal, and the resistance height of a metal line is increased. Also, the latter method has a problem that the anti-reflective coating layer must be removed in a following process and the metal line with aluminum nitride on top has electromigration resistance.

SUMMARY OF THE INVENTION

An object of the present invention is to provide a method for forming a metal line of a semiconductor device, in which a (TiAl)N anti-reflective coating layer is used for effectively preventing a metal line from reflecting and exactly forming a fine metal line pattern in lightening process by using a shorter wavelength such as DUV.

In accordance with the object of the present invention, there is provided a method for forming metal line of an integrated semiconductor device, comprising the steps of: forming a metal layer on a semiconductor substrate; forming an anti-reflective coating layer comprising (TiAl)N on the metal layer; forming a photosensitive layer pattern on the anti-reflective coating layer; selectively etching the (TiAl)N anti-reflective coating layer and the metal layer so as to form the metal line; and removing the photosensitive layer pattern.

The present invention is characterized in forming a fine metal line by using a (TiAl)N anti-reflective coating layer which has a low reflectivity and permeability

BRIEF DESCRIPTION OF THE DRAWING

The object, features and advantages of the present invention are understood within the context of the description of the preferred embodiment as set forth below. The description of the preferred embodiment is understood within the context of accompanying drawing. Which form a material part of this disclosure, wherein.

DESCRIPTION OF THE PREFERRED EMBODIMENT

The description of the preferred embodiment as set forth below.

Figure 1:
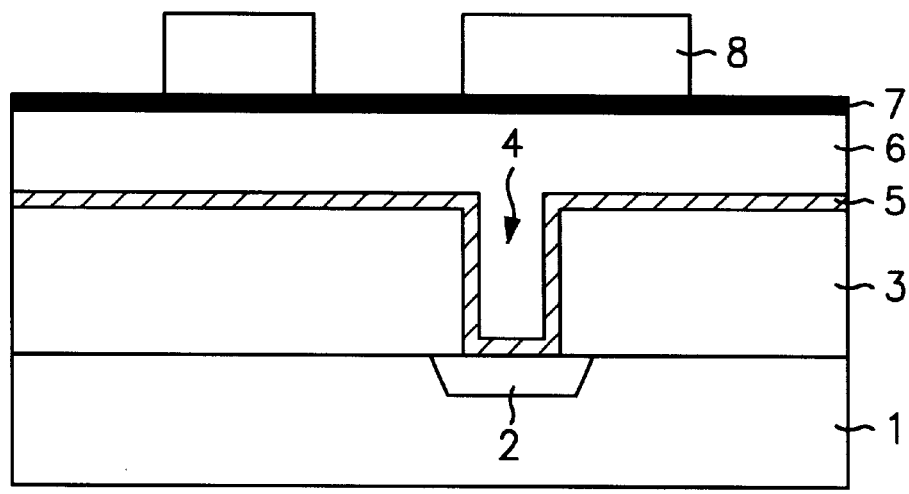
FIG. 1 and FIG. 2 show cross section views illustrating the metal line forming processes of a semiconductor device according to a preferred embodiment of the present invention.

As illustrated to FIG. 1, an interlayer insulating layer 3 formed on semiconductor substrate 1 is selectively etched to form a contact hole 4 exposuring a junction region 2 on the semiconductor substrate 1, then a diffusion barrier layer 5 and metal layer 6 are formed sequentially.

Then, as an anti-reflective coating layer, a (TiAl)N layer 7 having a thickness of 100Å–1000 Å is formed on the metal layer 6. The (TiAl)N layer 7 may be formed by sputtering, in which a TiAlx target in a nitrogen containing ambient is used and a power of 2–20 kilowatts is applied. It is preferable to use TiAlx target which has Al in ratio of 5–70 at %(atomic %) for forming a thin film with high electric conductivity and low reflectivity.

Further, the (TiAl)N layer7 may be formed by a plasma enhanced chemical vapor deposition(PECVD) using $TiCl_4$, $AlCl_3$ and $N_2$. In this method, $H_2$ may be added to the gases, applied power may be from 10–1000 watts, under the range of 300° C.–450° C. in temperature.

The resulting (TiAl)N layer has a ratio of Al/(Ti+Al) being from 5–80 at %. Then, a photosensitive pattern 8 is formed on the (TiAl)N layer 7.

Figure 2:
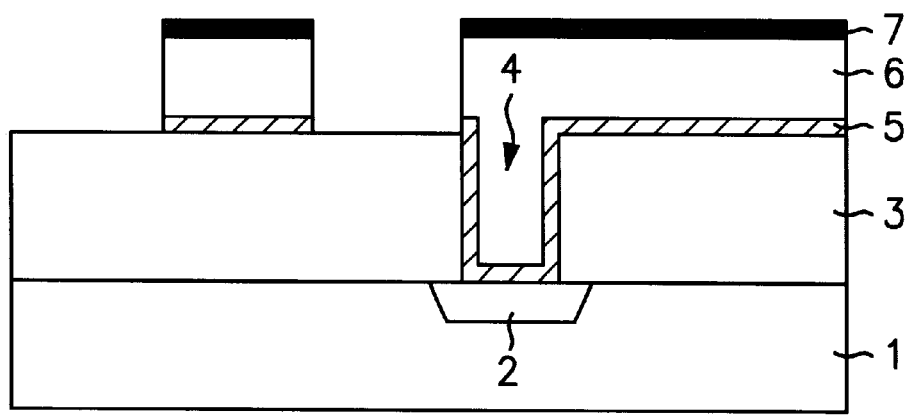

As illustrated FIG. 2, the (TiAl)N layer 7, the metal layer 6, and the diffusion barrier layer 5 are selectively etched to form a metal line using the photosensitive pattern 8 as an etching mask, and then the photosensitive pattern 8 is removed.

As describe above, in accordance with the invention, an antireflective coating layer is formed of a (TiAl)N layer, so that a metal line can be prevented from reflecting in lightening process using DUV wavelength. Thus, a critical dimension of a metal line pattern can be smaller, and a fine pattern can be formed exactly.

Also, since an anti-reflective coating layer is a single layer, the number of process steps required for forming a metal line can be decreased. Furthermore, (TiAl)N anti-reflective coating enhances the resistance of electromigration.

Although a preferred embodiment of the present invention has been illustrated and described, various alternatives, modifications and equivalents may be used. Therefore, the foregoing description should not be taken as limiting the scope of the present invention which is defined by the appended claims.

What is claimed is:

1. A method for forming a metal line of an integrated semiconductor device, comprising the steps of:

forming a metal layer on a semiconductor device;

forming an anti-reflective coating layer composed of (TiAl)N on the metal layer wherein the (TiAl)N layer is formed by a plasma enhanced chemical vapor deposition using $TiCl_4$, $AlCl_3$, and $N_2$ and the (TiAl)N layer is formed by applying a power of 10–1000 watts at a temperature of 300–450° C.;

forming a photosensitive layer pattern on the (TiAl)N anti-reflective coating layer;

selectively etching the (TiAl)N anti-reflective coating layer and the metal layer, so as to form the metal line; and removing the photosensitive layer pattern.

* * * * *

UNITED STATES PATENT AND TRADEMARK OFFICE
CERTIFICATE OF CORRECTION

PATENT NO. : 6,258,725 B1  
DATED : July 10, 2001  
INVENTOR(S) : Lee et al.

Page 1 of 1

It is certified that error appears in the above-identified patent and that said Letters Patent is hereby corrected as shown below:

<u>Title page,</u>  
Item [56], References Cited, patent number 5,981,416, please delete inventor name "Kune" and insert -- Kume --.

Signed and Sealed this

Sixteenth Day of April, 2002

JAMES E. ROGAN  
*Director of the United States Patent and Trademark Office*

*Attest:*

*Attesting Officer*

UNITED STATES PATENT AND TRADEMARK OFFICE
CERTIFICATE OF CORRECTION

PATENT NO. : 6,258,725 B1  
DATED : July 10, 2001  
INVENTOR(S) : Lee et al.

It is certified that error appears in the above-identified patent and that said Letters Patent is hereby corrected as shown below:

<u>Title page,</u>  
Item [73], Assignee, please delete "Yundai Electronics Industries Co., Ltd." and insert -- Hyundai Electronics Industries Co., Ltd. --

Signed and Sealed this

Third Day of December, 2002

JAMES E. ROGAN  
*Director of the United States Patent and Trademark Office*